(12) United States Patent
Haupt et al.

(10) Patent No.: US 6,219,247 B1
(45) Date of Patent: Apr. 17, 2001

(54) CONTROL UNIT FOR A MOTOR VEHICLE

(75) Inventors: Detlef Haupt, Steinsberg; Frank Franzen, Regensburg, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/377,604

(22) Filed: Aug. 19, 1999

(30) Foreign Application Priority Data

Aug. 19, 1998 (DE) .............................................. 198 37 663

(51) Int. Cl.⁷ ...................................................... H05K 7/20
(52) U.S. Cl. ...................... 361/707; 29/840; 174/266; 361/707; 361/773; 361/776; 361/749
(58) Field of Search ................ 29/831, 840, 846, 29/852, 857; 174/261–262, 266; 361/600, 679, 704, 707, 710, 715, 729, 749, 760, 772–778, 790, 792, 782–783, 795, 807, 809, 813

(56) References Cited

U.S. PATENT DOCUMENTS

| | | | |
|---|---|---|---|
| 2,869,040 | * 1/1959 | Pifer | 147/261 |
| 3,377,514 | * 4/1968 | Ruehlemann et al. | 361/767 |
| 4,374,603 | 2/1983 | Fukunaga et al. | |
| 4,538,210 | * 8/1985 | Schaller | 361/764 |
| 4,736,266 | * 4/1988 | Tanibe | 361/792 |
| 5,606,198 | * 2/1997 | Ono et al. | 257/666 |
| 5,848,466 | * 12/1998 | Viza et al. | 29/840 |
| 5,926,376 | * 7/1999 | Cho | 361/761 |

FOREIGN PATENT DOCUMENTS 2024126   11/1971  (DE) .
19712842C1  8/1998  (DE) .

* cited by examiner

Primary Examiner—Gregory Thompson
(74) Attorney, Agent, or Firm—Herbert L. Lerner; Laurence A. Greenberg; Werner H. Stemer

(57) ABSTRACT

A control unit for a motor vehicle has a base plate with press-fit openings. A conductor track carrier is mounted on the base plate. The conductor-track carrier has electrical contacting tabs in the area of the press-fit openings. An electrical contact pin that projects from a supporting body is inserted into a press-fit opening in the base plate and there contacts the contacting tab. By virtue of a reserve of material which is reduced (used) as the contact pin is pressed in, the contacting tab is anchored in the press-fit opening in an essentially tension-less manner.

22 Claims, 5 Drawing Sheets

CONTROL UNIT FOR A MOTOR VEHICLE

BACKGROUND OF THE INVENTION

FIELD OF THE INVENTION

The invention belongs to the automotive arts. Specifically, the invention relates to a control unit for a motor vehicle. The control unit comprises a base plate formed with press-fit openings in an outer area; a conductor-track carrier mounted on the base plate and formed with conductor tracks that are routed to the press-fit openings and that each have electric contacting tabs formed in the area of the press-fit openings. An electronic circuit is electrically connected to the conductor-track carrier, and a housing cover is coupled in an oil-tight manner to the base plate. A plastic supporting body is coupled to the base plate in a bearing area and at least one electric conductor is encapsulated within the supporting body. A contact pin that is electrically connected to the conductor emerges from the supporting body in the bearing area projects into a press-fit opening in the base plate and there establishes an electrical connection with a contacting tab of the conductor-track carrier. The invention further pertains to a method of producing a control unit of that kind.

The integration of engine and gearbox control units into the motor-vehicle subassembly that is to be controlled by the control unit (i.e., the engine or gearbox) is already known in the art. Integrated control units of the kind must be sealed off from oil, remain functional over a wide temperature range (about −40° C. to 140° C.) and be highly resistant to vibration (up to about 40 g). Furthermore, the units must meet particularly high reliability requirements since removing the units from the engine or the gearbox and refitting them, as required for repair, is very costly.

A control unit as generally described above is disclosed in the commonly assigned German patent application 197 12 842.4 (published after the priority date of this application). The earlier disclosure has a housing of simple construction which can be produced economically. The control unit is supported by a supporting body in which the housing cover is integrally formed. The electrical conductors in the supporting body are connected electrically to the electronic circuit in the control-unit housing by means of conductor pins, which are provided in a bearing area of the housing cover, project into insulating bushes of the base plate and there in each case establish an electrical connection with a conductor-track tab of the conductor-track carrier. The tab is pulled into the insulating bush.

That control unit essentially meets the above-mentioned requirements with regard to oil-tightness, ability to function over a wide temperature range, and vibration resistance.

SUMMARY OF THE INVENTION

It is nevertheless an object of the invention to provide a motor vehicle control unit, which overcomes the disadvantages of the heretofore-known devices and methods of this general type and which can be produced economically and, at the same time, provides contacting of the electronic circuit to the electrical conductors in the supporting body in a manner which is particularly operationally reliable and stable in the long term. It is a further object of the invention to specify a method for producing a control unit of that kind.

With the foregoing and other objects in view there is provided, in accordance with the invention, a control unit for a motor vehicle, comprising:

a base plate having an outer area formed with a plurality of press-fit openings;

a conductor-track carrier mounted on the base plate and having conductor tracks routed to the press-fit openings and each including an electric contacting tab formed at the press-fit openings;

an electronic circuit connected electrically to the conductor-track carrier;

a housing cover connected in an oil-tight manner to the base plate; and a plastic supporting body having a bearing area coupled to the base plate, carrying at least one encapsulated electric conductor, and a contact pin electrically connected to the conductor, the contact pin emerging from the supporting body in the bearing area, projecting into a respective one of the press-fit openings formed in the base plate, and electrically contacting a respective one of the contacting tabs of the conductor-track carrier;

wherein the contacting tab of the conductor-track carrier is formed with a reserve of material diminishing as the contact pin is pressed into the respective the press-fit opening, whereby the reserve of material causes the contacting tab to be anchored in the press-fit opening in an essentially tension-relieved manner.

The anchoring of the contacting tab in the press-fit opening in a manner which is essentially relieved of tension, as provided according to the invention, ensures a number of advantages. Since there is a free length of contacting tab available during the entire press-fitting process owing to the reserve of material, there are virtually no, or only very slight, shearing and tensile forces on the contacting tab in the area of the edge of the press-fit opening. Tearing of the contacting tab during the pulling-in operation can thus be reliably prevented and an essentially stress-free or at least low-stress end position of the contacting tab in the press-fit opening as regards shearing and tensile forces is also achieved. This is advantageous because the contact location is significantly less sensitive to environmental effects such as vibration or extension of the material due to changes in temperature in the low-stress or stress-free state than when it is under tension. Another advantage is that, by virtue of the reserve of material, the contacting tab is always drawn into the press-fit opening together with the contact pin and essentially without a movement relative to the latter. The pressure contacting to which this gives rise generally has better electrical contact properties than friction contacting because, unlike friction contacting, no damage to the contact surfaces occurs. Another advantage achieved by means of the invention is that, by virtue of the reduction in the shearing and tensile forces that occurs during press-fitting, the total press-in force that has to be applied when joining the supporting body and the base plate together is reduced. Since, in practice, there is generally a multiplicity of contact pins, this effect is very desirable because a joining process that takes place under comparatively low mechanical loading is easier to control in terms of production engineering and can therefore be carried out more reliably.

If the length of the reserve of material of the contacting tab is equal to the penetration depth of the contact pin into the press-fit opening (i.e. the free length of the contact pin minus a slight gap between the base plate and supporting body joined together), the reserve of material is just used up as the base plate is joined to the supporting body but the tension-relieved state in the end position is not compromised. However, the length of the reserve of material can be greater than the penetration depth of the contact pin into the press-fit opening.

In accordance with an added feature of the invention, the length of the reserve of material of the contacting tab is greater than the diameter of the press-fit opening.

For optimized process reliability from a production-engineering point of view, the press-fit connection should be designed in such a way that the contacting tab is drawn into the press-fit opening virtually without friction. This can be influenced both by the choice of material for the joining partners and by means of their structural design. As regards their structural design, the free end of the contact pin is preferably rounded, in particular hemispherical, and/or the press-fit opening is provided with an insertion bevel in its entry area. This ensures that the contact pin slides into the press-fit opening and the shearing and tensile forces grow only gradually. It is thereby possible to prevent the contact pins from sticking in the press-fit opening, this being advantageous since, as is well known, significantly higher forces are required for pressing in once sticking has occurred than for maintaining a continuous sliding process (static friction>sliding friction).

It is also advantageous if as high as possible adhesion arises between the contact pin and the contacting tab as the contact pin is pressed in. The contact pin therefore preferably has a structured or roughened peripheral surface in the area in which it bears against the contacting tab. In corresponding fashion, the contacting tab can have an exposed, roughened or structured metallic contact zone on that side of its surface which faces away from the base plate.

On the other hand, the nature of the peripheral wall of the press-fit opening and of the underside of the contacting tab should be chosen so that the friction between these two surfaces is as low as possible. Accordingly, the contacting tab preferably has a polyimide material on its underside, while the press-fit opening is preferably formed from an oil-resistant plastic with a low tendency to creep, in particular polyamide.

In accordance with an additional feature of the invention, the press-fit opening can, on the one hand, be implemented as press-fit bushes inserted into the base plate or, on the other hand, as openings in a plastic frame extending around the periphery of the base plate and coupled to the latter.

If the housing cover is formed in one piece with the supporting body, an oil-tightly sealed housing accommodating the electronic circuit is formed at the same time as the supporting body and the base plate are joined together.

With the above and other objects in view there is also provided, in accordance with the invention, a method of producing a control unit for a motor vehicle, which comprises the following steps:

providing a base plate with press-fit openings in an outer area of the plate;

mounting a conductor-track support on the base plate such that contacting tabs electrically connected to conductor tracks of the conductor-track support each come to lie above the press-fit openings formed in the base plate;

contacting the conductor-track carrier with an electronic circuit arranged on the base plate;

forming a plastic supporting body in which at least one encapsulated electrical conductor is routed and a contact pin electrically connected to the conductor projects from the supporting body in a bearing area;

producing a reserve of material of the contacting tab; and assembling the supporting body and the base plate by inserting the contact pin into the press-fit openings together with the contacting tab, and thereby reducing the reserve of material and forming an electrical connection between the contact pin and the contacting tab.

In accordance with a first preferred variant of the novel method, to produce the reserve of material, a tab lifter is pushed through the press-fit opening from below and raises a free area of the contacting tab to a predetermined height above the base plate, in that a spacer element of predetermined height is inserted between the base plate and the raised contacting tab, in that the tab lifter is pulled back out of the press-fit opening, in that the supporting body and the base plate are brought closer together until the front end of the contacting tab has been fixed at the entry area of the press-fit opening by means of the contact pin, and in that the spacer element is removed to allow the supporting body and the base plate to be joined together.

In accordance with a second preferred variant embodiment of the novel method, to produce the reserve of material, a tab lifter is pushed from below through a tab-lifter opening formed in the base plate adjacent to the press-fit opening underneath the route path of the contacting tab, a free area of the contacting tab being raised to a predetermined height above the base plate, in that the supporting body and the base plate are brought closer to one another until a front end of the contacting tab has been fixed in the entry area of the press-fit opening by means of the contact pin, and in that the tab lifter is pulled back out of the tab-lifter opening to allow the supporting body and the base plate to be joined together.

Finally, in a third variant, neither a spacer element nor a specially formed tab-lifter opening in the base plate are required to produce the reserve of material. This variant is wherein, to produce the reserve of material, a tab lifter is pushed through the press-fit opening from below and raises a free area of the contacting tab to a predetermined height above the base plate, in that the supporting body and the base plate are brought closer together until a front end of the contacting tab has been fixed between a front end of the contact pin and a front end of the tab lifter, and in that, while maintaining the positional fixing of the contacting tab between the contact pin and the tab lifter, the supporting body and the base plate are brought closer together until the front end of the contacting pin has been fixed in the entry area of the press-fit opening by means of the contact pin.

Other features which are considered as characteristic for the invention are set forth in the appended claims.

Although the invention is illustrated and described herein as embodied in a control unit for a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3b is a perspective view of the configuration of FIG. 3a;

FIG. 3c is a plan view thereof;

FIG. 4b is a perspective view of the configuration of FIG. 4a;

FIG. 6a is a diagrammatic, partially sectional view of the base plate in the region of a press-fit opening with a tab lifter passed through;

FIG. 6b is a perspective view of the configuration of FIG. 6a; and

DESCRIPTION OF THE PREFERRED EMBODIMENTS

Figure 1:
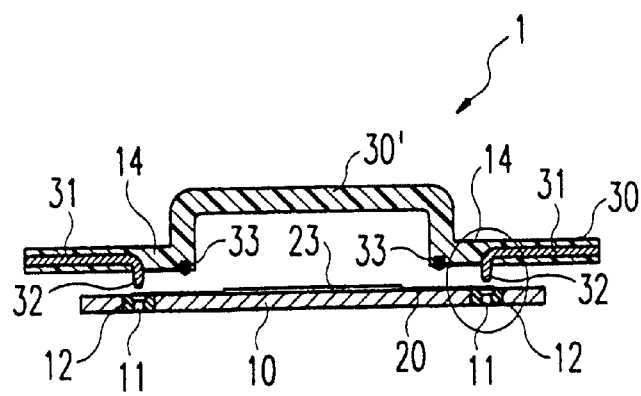
FIG. 1 is a diagrammatic sectional view of a supporting body with an integrated housing cover and a base plate.

Referring now to the figures of the drawing in detail and first, particularly, to FIG. 1 thereof, there is seen a control unit 1, which is intended for installation in an automatic transmission. The housing of the control unit 1 is formed by a metallic base plate 10 and a housing cover 30' made of plastic. The housing cover 30' is formed integrally in a supporting body 30, which is secured on a hydraulic control plate of the transmission and accommodates electric lead wires, sensors and a plug connector. The latter components are arranged outside the interior of the housing of the control unit 1. Within the housing 10, 30' there is disposed an electronic circuit 23, mounted on a raised portion of the base plate 10. The circuit 23 is in the form of a ceramic substrate equipped with electronic components. The circuit 23 is surrounded by a flexible circuit board 20 which is laminated or glued onto the base plate 10 and contacts the electronic circuit 23 in the interior of the housing 10, 30'.

In its marginal border area, the metallic base plate 10 has holes 11, in which press-fit bushes 12 made of a plastics material are firmly anchored.

The housing cover 30' has a trough-shaped formation which merges laterally into bearing areas 14 of the supporting body 30, which are in the form of flat surfaces. An encircling seal 33 is mounted on the housing cover 30' in the area of the transition. The seal is a type of O-ring provided to seal off the interior of the housing from transmission fluid.

Electric lead wires 31 extend from the external components, such as the plug connectors and sensors, into the bearing area 14 of the supporting body 30 and there have electrically conductive contact pins 32 which project from the bearing area 14. The contact pins 32 can also be embodied in a simple manner as the bent-over ends of the lead wires 31.

During the production of the supporting body 30 with the housing cover 30', the electric lead wires 31 are either placed directly in an injection molding die or are fixed in position relative to one another beforehand, for example by molding on plastic webs, and are then encapsulated in the injection-molding die. This minimizes the outlay for the production of the supporting body 30 with the housing cover 30' since the above-mentioned design measures allow the supporting body 30, which is already present in an automatic transmission in any case, simultaneously to be used as the housing cover 30'. Here, the base plate 10 serves as a heat sink for the electronic circuit 23.

Figure 2:
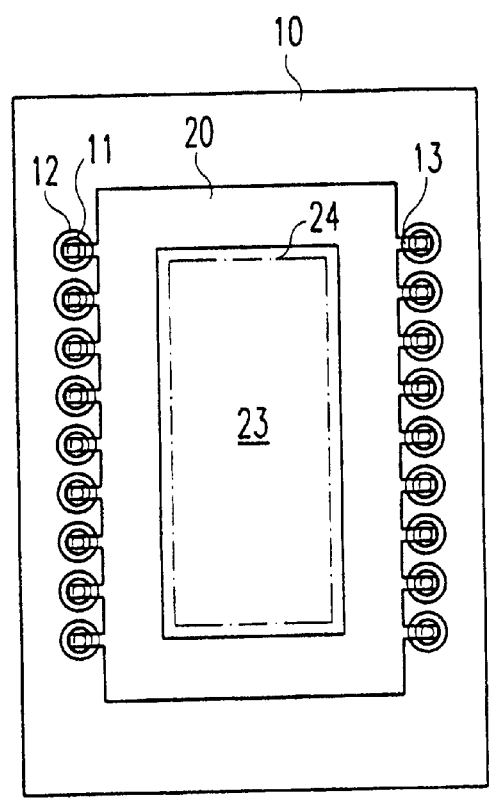
FIG. 2 is a plan view of the base plate formed with a flexible conductor-track film on top, with the housing cover removed.

Referring now to the plan view of FIG. 2, there is shown the structure on the base plate side illustrated in FIG. 1 (without the supporting body 30 and the housing cover 30').

A broken line in FIG. 2 indicates the outline 24 of the above-mentioned raised portion of the base plate 10, on which the electronic circuit 23 is secured by means of a thermally conductive adhesive. The flexible circuit board 20 adjoins the raised portion of the base plate 10 on all sides and extends around it, forming a rectangular cutout aperture. The ceramic circuit substrate carrying the electronic circuit 23 projects laterally somewhat beyond the raised portion (outline 24) and there forms an area of overlap with the flexible circuit board 20. In the area of overlap, the ceramic circuit substrate is adhesively bonded to the flexible circuit board 20 at contact points by means of an electrically conductive adhesive, giving rise to an electrical connection between the conductor tracks of the flexible circuit board 20 and the electronic circuit 23.

The flexible circuit board 20 can, for example, comprise a lower polyimide or polyester base film and an upper polyimide or polyester top film, between which the conductor tracks are accommodated. If considered necessary, they may be embedded in an adhesive layer. An insulating top coating can also be used instead of a top film.

The non-illustrated conductor tracks of the flexible circuit board 20 are routed to the press-fit bushes 12. There, the flexible circuit board 20 has contacting tabs 13 which each extend above the press-fit bushes 12 in the unassembled state of the supporting body 30 and the base plate 10. The contacting tabs 13 can be in the form of extensions formed on the edges of the flexible circuit board 20 or be embodied as stamped-out tongues in the flexible circuit board 20.

While, in the best mode embodiment, the base plate 10 is formed as a single metal plate, it is also possible to form the base plate with a "core" of metal (or other material) and to "frame" that inner plate with a plastic frame in which the openings 12 are formed. With reference to FIG. 2, the core plate would thereby correspond to the rectangle 20 and the frame around 20 (identified by the reference numeral 10) would be the plastic frame with the press-fit bushes 12.

Figure 3A:
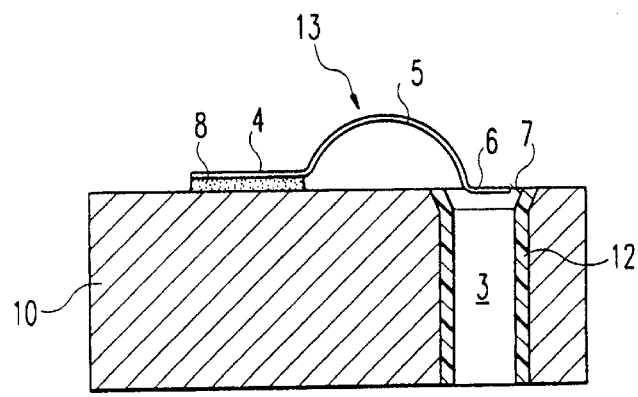
FIG. 3a is a diagrammatic, partially sectional view of the base plate in the region of a press-fit opening.

FIG. 3a shows a schematic, partial sectional representation of the base plate 10 in the area of a press-fit bush 12. The contacting tab 13 has a fixed tab area 4, which is fixed in position on the base plate 10 with the aid of an oil-resistant acrylic adhesive 8. Adjoining the fixed tab area 4 is a free tab area 5, on the top-side end portion of which there is formed an exposed metallic contact zone 6 which is in electrical contact with a conductor track extending within the contacting tab 13.

The free tab area 5 of the contacting tab 13 is in the form of a loop which is configured in such a way that the contact zone 6 at the end is arranged in the region of the middle of the press-fit bush. The loop shape of the free tab area 5 of the contacting tab 13 can either be preformed by suitable measures during the production of the flexible circuit board 20 or is produced by measures described in greater detail below before the contact pin 32 is pressed into the press-fit bush 12. The loop shape creates the reserve of material required for the essentially tension-relieved anchoring of the contacting tab 13 in the interior 3 of the press-fit bush 12.

In its insertion area, the press-fit bush 12 is provided with an insertion bevel 7 which makes it easier for the contact pin 32 to slide into the press-fit bush 12.

Figures 3B, 3C:
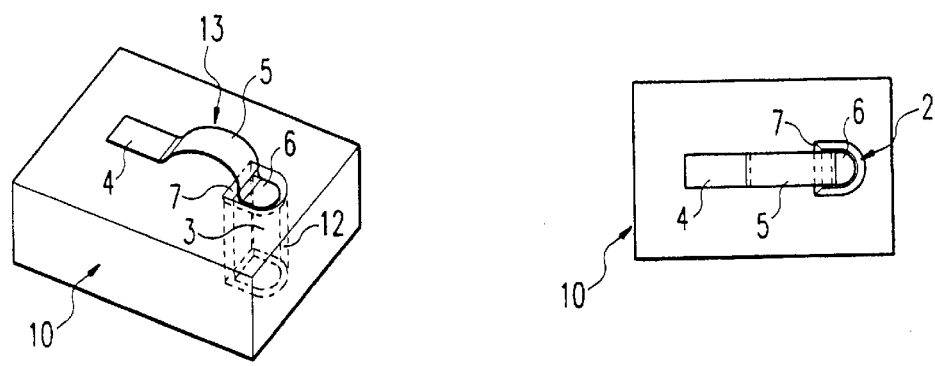

FIGS. 3b and 3c show the arrangement illustrated in FIG. 3a in perspective view and in plan view, respectively. The press-fit bush 12 has a semicircular or U-shaped cross section. The inner wall of the press-fit bush 12 adjacent to the contacting tab 13 is in the form of a flat surface that acts as a sliding surface for the free tab area 5 of the contacting tab 13.

A first production variant for the production of the required reserve of material will be explained with reference to FIGS. 4a to 4c.

With the free tab area 5 of the contacting tab 13 initially resting flat on the base plate 10, a tab lifter of needle-shaped design is inserted from below in a manner not shown into the interior 3 of the press-fit bush 12 in the direction of the arrow 2. The front end of the tab lifter strikes the underside of the contacting tab 13 overlapping the press-fit bush 12 and raises the free tab area 5 of the contacting tab 13 from the base plate 10. This makes it possible to insert a wire 9, composed, for example, of plastic or metal, between the base plate 10 and the raised free tab area 5 of the contacting tab 13. The inserted wire 9 serves as a spacer element between the base plate 10 and the contacting tab 13 and has the effect of keeping in reserve tab material which is required to achieve the tension-relieved press-fit connection. Once the wire 9 has been inserted, the non-illustrated tab lifter can be pulled back out of the press-fit bush 12. The free area of the contacting tab 13 is supported by the wire 9 and remains spaced apart from the base plate 10. The thickness of the inserted wire 9 can be chosen so that the length of the tab material held in reserve by the inserted wire 9 corresponds exactly to the length by which the contacting tab 13 projects over the center of the press-fit bush 12 in the extended state.

Figure 4A:
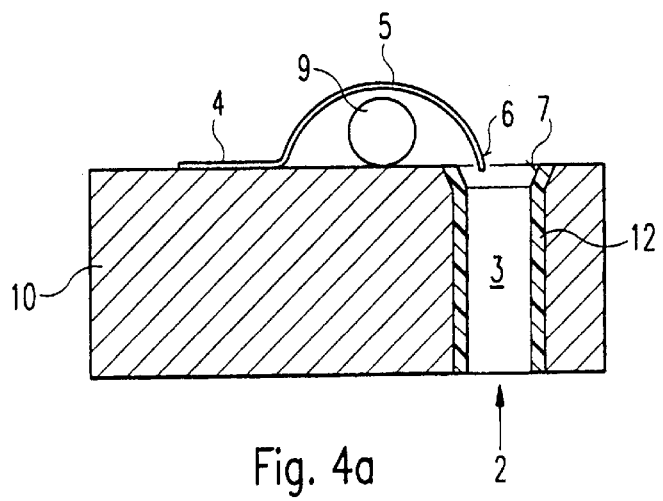
FIG. 4a is a diagrammatic, partially sectional view of the base plate in the region of a press-fit opening with a spacer element inserted between the base plate and the contacting tab.
Figure 4B:
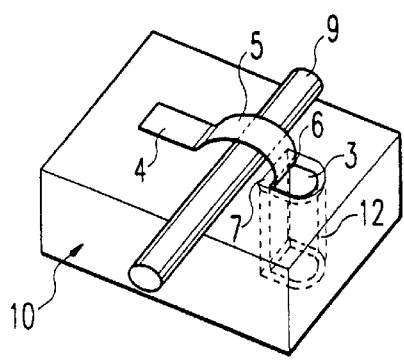
Figure 4C:
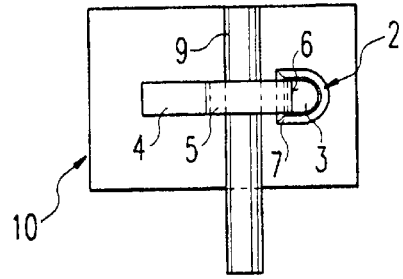
FIG. 4c is a plan view thereof.

Given the linear arrangement of the press-fit bushes 12 as shown in FIG. 2, only one wire 9 per longitudinal side is required to form the reserve of material illustrated in FIGS. 4*a* to 4*c* on all the contacting tabs 13. If a plurality of parallel rows of press-fit bushes 12 are formed on one side (longitudinal or broad side) in a manner not shown, a plurality of parallel wires 9 can be used. It is also possible, in the case of a nonlinear arrangement of press-fit bushes 12, to use correspondingly bent wires.

The contact pins 32 are then inserted into the press-fit bushes 12 in three steps:

In a first step, the supporting body 30 is brought close to the base plate 10, the contact pins 32 being held in alignment with the press-fit bushes 12. In the process, the free tab area 5 of the contacting tab 13 is guided around the inserted wire 9 into the press-fit bush 12. During this process, the metal pins 32 are initially inserted into the press-fit bushes 12 only until, on the one hand, the contacting tabs 13 are fixed in position in the press-fit bushes 13 and, on the other hand, the inserted wire 9 can still be pulled out from under the contacting tabs 13 without problems.

In a second step, the inserted wires 9 are pulled out from between the contacting tabs 13 and the base plate 10. The loop-shaped form of the contacting tabs 13 in their free tab areas 5 is maintained.

In a third step, the supporting body 30 and the base plate 10 are brought closer together. In the process, the contacting tabs 13 are taken along by the contact pins 32 as they penetrate into the press-fit bushes 12. The contact pins 32 are pushed in simultaneously. By virtue of the good adhesion between the contact pins 32 and the metallic contact zones 6 of the contacting tabs 13 on the one hand, and the low sliding friction between the undersides of the contacting tabs and the inner walls of the press-fit bushes, on the other hand, the contacting tabs 13 are taken along over the entire length of the contact pins 32, with relatively low frictional forces and hence overall push-in forces arising. To ensure that the contacting tabs 13 are pulled in in an essentially tension-free manner and to ensure that they are essentially relieved of tension in their end position, it is necessary that the length of contacting-tab material held in reserve by means of the wire 9 is in each case greater than or at least equal to the length of the contacting-tab material pulled into the press-fit bush 12 in the end position.

Figure 5:
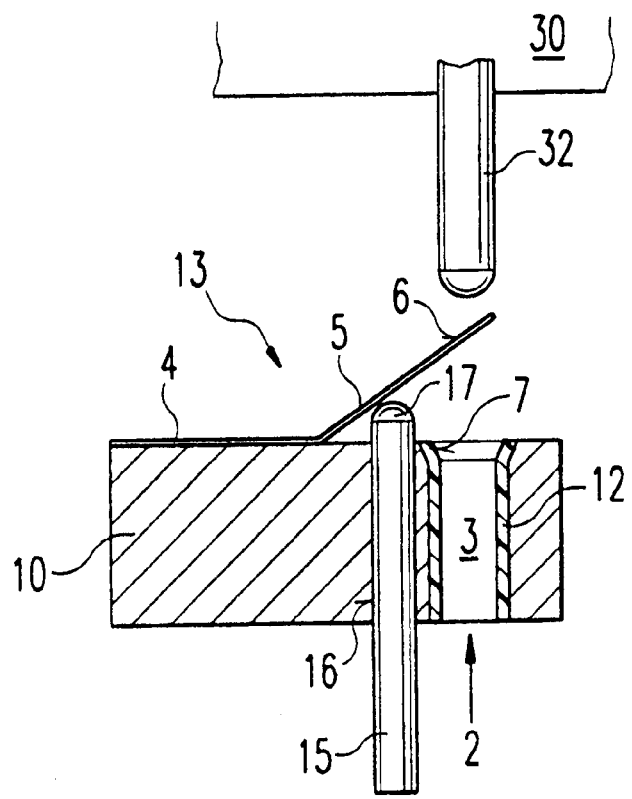
FIG. 5 is a schematic, partially sectional view of the base plate in the region of a press-fit opening with a tab-lifter opening formed adjacent to it.

A second version for the formation of the reserve of material, to be provided according to the invention, of the contacting tabs 13 is illustrated in schematic form in FIG. 5. Parts that are identical to those in FIGS. 3*a* to 4*c* are indicated by identical reference numerals. A tab-lifter hole 16 is formed in the base plate 10 adjacent to the press-fit bush 12. The tab-lifter hole 16 has passed through it a tab lifter 15 of needle-shaped configuration with a rounded head 17 which is supported in the tab-lifter hole 16 in a manner which allows sliding displacement. The tab-lifter hole 16 extends underneath the free tab area 5 of the contacting tab 13.

Before the supporting body 30 is joined to the base plate 10, the tab lifter 15 is guided upward through the tab-lifter hole 16 and, in the process, raises the free tab area 5 of the contacting tab 13 (FIG. 5). This process is performed simultaneously on all contacting tabs 13. As in the first variant of the method, the contacting tabs 13 are once again to be lifted until the length of material held in reserve at the beginning of the subsequent pushing in of the contact pins 32 in each case corresponds at least approximately to the push-in depth of the contact pin 32. Once again, the supporting body 30 is joined to the base plate 10 in three steps:

In a first step, the supporting body 30 and the base plate 10 are brought closer together until that end of the contacting tab 13 which is passed around the head 17 of the tab lifter 15 is fixed in position between the insertion area of the press-fit bush 12 and the front end of the contact pin 32. This creates a loop-shaped reserve of material in the free tab area 5 of the contacting tab 13.

In a second step, the tab lifter 15 is retracted from the tab-lifter hole 16. The loop-shaped reserve of material is retained in the process.

In a third step, the supporting body 30 is pressed together with the base plate 10 in a manner similar to that in the first variant already described.

The tab-lifter hole 16 can be provided as an integral parallel hole in the press-fit bush 12. In this case, it brings about an increase in the elasticity of shape of the press-fit bush 12 and thus further reduces the overall press-in force required to press the contact pin 32 in. It is also advantageous that the increase in the elasticity of the press-fit bush 12 occurs only locally in the area of the contacting tab 13 which is drawn in.

Figure 6A:
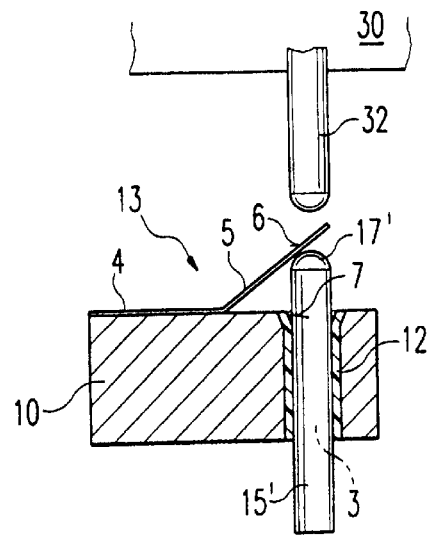
Figure 6B:
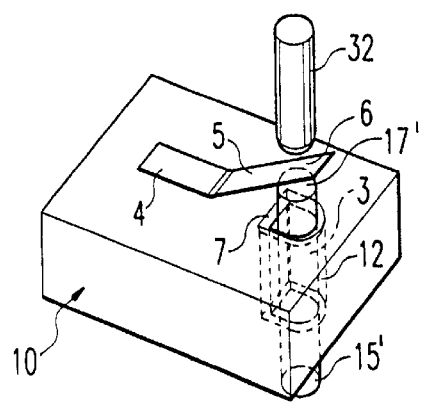
Figure 6C:
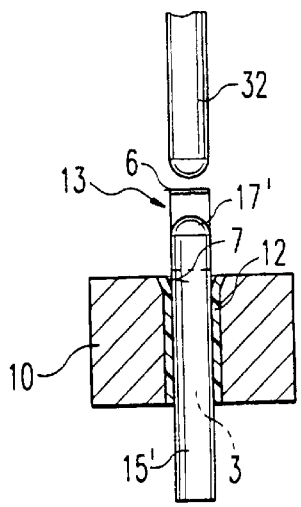
FIG. 6c is a schematic, cross-sectional view thereof.

FIGS. 6*a* to 6*c* show a third variant for the production of the reserve of material required according to the invention.

This variant differs from the second variant in that here a tab lifter 15' is not passed through an additionally introduced tab-lifter hole 16 but directly through the interior 3 of the press-fit bush 12. The tab lifter 15' is passed through the press-fit bush 12 from the underside of the base plate 10 and raises the free tab area 5 of the contacting tab 13 from its underside. Here too, as in variants 1 and 2 explained above, the amount of lift determines the length of the material held in reserve.

Once again, the supporting body 30 is joined together with the base plate 10 in three steps:

In a first step, the supporting body 30 and the base plate 10 are first of all moved together until the rounded head of the contact pin 32 comes into contact with the upper side of the raised tab area 5. In the process, the contacting tab 13 is clamped in its free tab area 5 between the front end of the contact pin 32 and the head 17' of the tab lifter 15' and is fixed in its position relative to the contact pin 32 and the tab lifter 15'.

In a second step, the supporting body 30 and the base plate 10 are brought closer together until the front end of the contact pin 32 enters the insertion area of the press-fit bush 12. During that step, the end of the contacting tab 13 remains clamped between the contact pin 32 and the tab lifter 15'. This ensures that the tab material required when the contacting tab 13 is subsequently drawn in is shaped into a loop. In terms of design, this can be achieved in a simple manner if the tab lifter 15' is supported by a compression spring and is pressed downwardly by the contact pin 32 against the spring force. Once the second step has been carried out, the front end of the contacting tab 13 is pressed into the insertion area of the press-fit bush 12 by means of the contact pin 32.

If the spring travel of the tab lifter 15' is made sufficiently large to avoid hindering the pressing of the contact pin 32 into the press-fit bush 12, it is not necessary to remove the tab lifter 15' from the press-fit bush 12 or manipulate it from the outside in any other way before the pressing-in step which then follows.

In the subsequent pressing-in step (the third step in the method), the contacting tab 13 engaged by the contact pin 32 is then drawn into the press-fit bush 12 in the manner already described. After the pressing-in step, all that is then required is to remove the supporting body 30 with the base plate 10 pressed onto it from a work carrier (not shown) containing the tab lifters 15'. The work carrier has the spring-mounted holders (see above) for the tab lifters 15' and can furthermore be equipped with an adjusting device by means of which a variable maximum lifting height of the tab lifters 15' can be specified.

One advantage of the third variant is that all the steps of the method can be performed continuously, i.e. in a single work cycle, since the separate removal of the wire 9 or tab lifters 15 required in the first and second variants of the method here takes place automatically by virtue of the spring mounting of the tab lifters 15'.

All the embodiment variants are comparable in their effect and ensure that there is always a sufficient length of contacting tab in reserve in the free tab area 5 of the contacting tab 13 to ensure essentially tension-free insertion and an essentially tension-relieved end position of the contacting tab 13 in the press-fit bush 12.

We claim:

1. A control unit for a motor vehicle, comprising:
   a base plate having an outer area formed with a plurality of press-fit openings;
   a conductor-track carrier mounted on said base plate and having conductor tracks routed to said press-fit openings and each including an electric contacting tab formed at said press-fit openings;
   an electronic circuit connected electrically to said conductor-track carrier;
   a housing cover connected in an oil-tight manner to said base plate; and
   a plastic supporting body having a bearing area coupled to said base plate, carrying at least one encapsulated electric conductor, and a contact pin electrically connected to said conductor, said contact pin emerging from said supporting body in said bearing area, projecting into a respective one of said press-fit openings formed in said base plate, and electrically contacting a respective one of said contacting tabs of said conductor-track carrier;
   wherein said contacting tab of each of said conductor tracks of said conductor-track carrier is formed with a protuberance having a size, and said size of said protuberance diminishes when said contact pin is pressed into said respective one of said press-fit openings, and whereby said protuberance causes said contacting tab to be anchored in said respective one of said press-fit openings in an essentially tension-relieved manner.

2. The control unit according to claim 1, wherein said protuberance is formed from a length of material that is substantially equal to a penetration depth of said contact pin in said respective one of said press-fit openings.

3. The control unit according to claim 2, wherein said respective one of said press-fit openings has a given diameter and the length of said material forming said protuberance is greater than said diameter of said respective one of said press-fit openings.

4. The control unit according to claim 1, wherein said contact pin has a rounded free end.

5. The control unit according to claim 1, wherein said contact pin has a hemispherically rounded free end.

6. The control unit according to claim 1, wherein said respective one of said press-fit openings has an entry area facing towards said supporting body, and said entry area is formed with an insertion bevel.

7. The control unit according to claim 1, wherein said contact pin has a defined contact area for contacting said contacting tab, said contact pin having a structured or roughened peripheral surface in said contact area.

8. The control unit according to claim 1, wherein said contacting tab has a surface facing away from said base plate that defines a contact zone and said surface is an adhesion promoting surface selected from the group consisting of a roughened surface and a structured surface.

9. The control unit according to claim 1, wherein said contacting tab has a surface facing said respective one of said press-fit openings that is formed from an electrically insulating material having a relatively low coefficient of friction.

10. The control unit according to claim 9, wherein said material having the relatively low coefficient of friction is a polyimide material.

11. The control unit according to claim 1, wherein said base plate is a metal plate and said press-fit openings are press-fit bushes made of oil-resistant plastic with a low tendency to flow.

12. The control unit according to claim 11, wherein said oil-resistant plastic is polyamide.

13. The control unit according to claim 1, wherein said base plate includes an inner plate and a plastic frame surrounding said inner plate, said plastic frame is coupled to said inner plate, and said press-fit openings are formed in said plastic frame.

14. The control unit according to claim 1, wherein said supporting body and said housing cover are integrally formed in a one-piece structure.

15. The control unit according to claim 1, wherein the control unit is disposed in one of a gearbox and engine housing.

16. A method of producing a control unit for a motor vehicle, which comprises the following steps:
   providing a base plate with press-fit openings in an outer area of the plate;
   mounting a conductor-track support on the base plate such that contacting tabs electrically connected to conductor tracks of the conductor-track support each come to lie above the press-fit openings formed in the base plate;
   contacting the conductor-track carrier with an electronic circuit arranged on the base plate;

forming a plastic supporting body in which at least one encapsulated electrical conductor is routed and a contact pin electrically connected to the conductor projects from the supporting body in a bearing area;

producing at least one of the contacting tabs with a protuberance having a size; and assembling the supporting body and the base plate by inserting the contact pin and the one of the contacting tabs into one of the press-fit openings, and thereby reducing the size of the protuberance and forming an electrical connection between the contact pin and the one of the contacting tabs.

17. The method according to claim 16, which comprises:

in the step of producing the protuberance, pushing a tab lifter through the one of the press-fit openings from below and raising a free area of the contacting tab to a predetermined height above the base plate;

inserting a spacer element of predetermined height between the base plate and the raised contacting tab;

pulling the tab lifter back out of the one of the press-fit openings;

mutually approaching the supporting body and the base plate until the contact pin fixes a front end of the contacting tab at an entry area of the one of the press-fit openings; and removing the spacer element and allowing the supporting body and the base plate to be joined together.

18. The method according to claim 17, which comprises selecting the predetermined height so that material forming the protuberance has a length corresponding substantially to a penetration depth of the contact pin into the one of the press-fit openings.

19. The method according to claim 16, which comprises:

in the step of producing the protuberance, pushing a tab lifter from below through a tab-lifter opening formed in the base plate adjacent to the one of the press-fit openings underneath a route path of the contacting tab, and thereby lifting a free area of the contacting tab to a predetermined height above the base plate;

mutually approaching the supporting body and the base plate toward one another until the contact pin fixes a front end of the contacting tab in the entry area of the one of the press-fit openings; and pulling the tab lifter back out of the tab-lifter opening to allow the supporting body and the base plate to be joined together.

20. The method according to claim 19, which comprises selecting the predetermined height so that material forming the protuberance has a length corresponding substantially to a penetration depth of the contact pin into the press-fit opening.

21. The method according to claim 16, which comprises:

in the step of producing the protuberance, pushing a tab lifter through the one of the press-fit openings from below and raising a free area of the contacting tab to a predetermined height above the base plate;

mutually approaching the supporting body and the base plate until the contact pin fixes a front end of the contacting tab between a front end of the contact pin and a front end of the tab lifter; and while maintaining a positional hold of the contacting tab between the contact pin and the tab lifter, mutually approaching the supporting body and the base plate until the contact pin fixes a front end of the contacting tab in an entry area of the press-fit opening and allows the supporting body and the base plate to be joined together.

22. The method according to claim 21, which comprises selecting the predetermined height so that material forming the protuberance has a length corresponding substantially to a penetration depth of the contact pin into the press-fit opening.

* * * * *